(12) United States Patent
Carter et al.

(10) Patent No.: US 7,271,533 B2
(45) Date of Patent: Sep. 18, 2007

(54) MULTI-STEP ORGANIC LIGHT-EMISSIVE DEVICES

(75) Inventors: Julian Carter, Cambridgeshire (GB); Stephen Karl Heeks, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 10/485,618

(22) PCT Filed: Jul. 29, 2002

(86) PCT No.: PCT/GB02/03459

§ 371 (c)(1),
(2), (4) Date: Aug. 23, 2004

(87) PCT Pub. No.: WO03/012892

PCT Pub. Date: Feb. 13, 2003

(65) Prior Publication Data

US 2005/0007012 A1   Jan. 13, 2005

(30) Foreign Application Priority Data

Aug. 1, 2001   (GB) ................................ 0118791.3

(51) Int. Cl.
*H05B 33/00* (2006.01)
(52) U.S. Cl. ....................................... 313/503; 428/690
(58) Field of Classification Search ................ 313/503, 313/504–512; 428/912, 690
See application file for complete search history.

(56) References Cited

U.S. PATENT DOCUMENTS

| | | | |
|---|---|---|---|
| 4,539,507 A | 9/1985 | VanSlyke et al. ........... | 313/504 |
| 5,917,279 A | 6/1999 | Elschner et al. ............ | 313/506 |
| 5,958,573 A * | 9/1999 | Spitler et al. ............... | 428/323 |
| 6,872,472 B2 * | 3/2005 | Liao et al. ................... | 428/690 |
| 6,929,872 B2 * | 8/2005 | Mori et al. ................. | 428/690 |

FOREIGN PATENT DOCUMENTS

| | | |
|---|---|---|
| EP | 777 279 A2 | 6/1997 |
| JP | 61-047785 | 3/1986 |
| JP | 07-235375 | 9/1995 |

(Continued)

OTHER PUBLICATIONS

"Preparation and Characterization of CdS and Cu/sub 2/S nanoparticle/polyaniline Composite Films", Chandrakanthi et al., Database Inspec. (Online), Institute of Electrical Engineers, Stevenage, GB, 1 page.

(Continued)

*Primary Examiner*—Joseph Williams
(74) *Attorney, Agent, or Firm*—Marshall, Gerstein & Borun LLP

(57) ABSTRACT

A light-emissive device including first and second electrodes, and a light-emissive layer located between the electrodes and containing organic light-emissive material including a plurality of particles spaced from each other by the light-emissive material, at least some of the particles being capable of injecting positive charge carriers into the light-emissive material and at least some of the particles being capable of injecting negative charge carriers into the light-emissive material; whereby electrical charge may pass between the electrodes via at least some of the particles to cause light to be emitted by the light-emissive material between those particles.

40 Claims, 1 Drawing Sheet

FOREIGN PATENT DOCUMENTS

| WO | WO 90/13148    | 11/1990 |
|----|----------------|---------|
| WO | WO 00/04593    | 1/2000  |
| WO | WO 00/76009 A1 | 12/2000 |

OTHER PUBLICATIONS

"Semiconductor Nanocrystals in Carrier-Transporting Polymers: Charge Generation and Charge Transport", Wang et al., Journal of Luminescence 70, 1996, pp. 48-59.

"Fabrication and Characteristics of ZnS Nanocrystals/Polymer Composite Doped with Tetraphenylbenzidine Single Layer Structure Light-Emitting Diode", Yang et al., American Institute of Physics, Appl. Phys. Lett. 69 (3), Jul. 15, 1996, pp. 377-379.

"Composite Thin Films of CdSe Nanocrystals and a Surface Passivating/Electron Transporting Block Copolymer: Correlations Between Film Microstructure by Transmission Electron Microscopy and Electroluminescence", Mattoussi et al., Journal of Applied Physics, vol. 86, No. 8, Oct. 15, 1999, pp. 4390-4399.

"Preparation and Characterization of CdS and $Cu^2S$ Nanoparticle/Polyaniline Composite Films", Chandrakanthi et al., Elsevier Science B. V., Thin Solid Films 417, 2002, pp. 51-56.

International Search Report in PCT/GB02/03459 dated Jul. 28, 2003.

Search Report in GB 0118791.3 dated Mar. 27, 2002.

* cited by examiner

MULTI-STEP ORGANIC LIGHT-EMISSIVE DEVICES

This is the U.S. national phase of International Application No. PCT/GB02/03459 filed Jul. 29, 2002, the entire disclosure of which is incorporated herein by reference.

BACKGROUND OF THE INVENTION

1. Field of the Invention

This invention relates to multi-step light-emissive devices and light-emissive organic materials.

2. Related Technology

An emerging class of display devices uses an organic material for light emission. Light-emissive organic materials are described in PCT WO90/13148 and U.S. Pat. No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes combine in the organic layer, generating photons. In PCT WO90/13148 the organic light-emissive material is a polymer. In U.S. Pat. No. 4,539,507 the organic light-emissive material is of the class known as small molecule materials, such as (8-hydroxyquinolino)aluminium ("Alq3"). In a practical device, one of the electrodes is typically transparent, to allow the photons to escape the device.

FIG. 1 illustrates the cross-sectional structure of a typical organic light-emissive device ("OLED"). The OLED is typically fabricated on a glass or plastic substrate 1 coated with a transparent first electrode 2 such as indium-tin-oxide ("ITO"). Such coated substrates are commercially available. This ITO-coated substrate is covered with at least a layer of a thin film of an electroluminescent organic material 3 and a final layer forming a second electrode 4, which is typically a metal or alloy. Other layers can be added to the device, for example to improve charge transport between the electrodes and the electroluminescent material.

Typically, the film 3 of organic material is around 60 to 100 nm thick. At these thicknesses the turn-on voltage for an OLED of the type shown in FIG. 1 is normally around 2V. Peak efficiency generally occurs at an applied voltage in the range from 2 to 6V. Once the voltage drop across the OLED is high enough to inject both carrier types satisfactorily into the device any additional voltage causes additional light to be emitted, but at a lower efficiency since extra work is done in transporting the carriers through the polymer at the higher electric field. For thicker devices the efficiencies are also lower because extra work has to be done in transporting the carriers further. At significantly higher applied voltages the device breaks down.

It would be desirable to use OLED technology for general lighting applications, such as domestic and commercial building lighting and external lighting such as street lighting. To do this efficiently it would be desirable for OLED devices to be capable of being driven efficiently from higher voltages than are currently employed for OLEDs: preferably by mains voltages of 220V or 110V, or higher.

One way to achieve this would be to form a stacked device by laminating together a number of devices of the type shown in FIG. 1, so that the cathode of one device feeds current to the anode of the next. This arrangement is illustrated in FIG. 2, in which like parts are numbered as for FIG. 1. If, say, 4V were dropped across each device in the stack, and the stack comprised 50 devices then 200V would be dropped across the entire stack. However, a device of this sort has a great number of electrode layers. Therefore, it is very difficult to arrange for the electrodes to be sufficiently transparent that they do not block a great deal of the light that is emitted by the devices of the stack. This is a major problem in building an efficient device to this architecture.

FIG. 3 shows the structure of a dispersed-type inorganic electroluminescent device. A device of this type uses an entirely different principle to emit light. Phosphor particles 10, for example comprising ZnS, are dispersed in a transparent conductive matrix 11 between anode and cathode electrodes 12, 13. When a suitable voltage is applied between the electrodes electrons are lifted from deep traps in the phosphor particles and accelerated to high energy. The high-energy electrons can then collide with light-emitting centres at the particles, where ionisation takes place. Thus, in a device of this type the emission is from the phosphor particles, not the matrix.

GENERAL DESCRIPTION OF THE INVENTION

According to one aspect of the present invention there is provided a light-emissive device comprising: first and second electrodes; and a light-emissive layer located between the electrodes and comprising organic light-emissive material including a plurality of particles spaced from each other by the light-emissive material, at least some of the particles being capable of injecting positive charge carriers into the light-emissive material and at least some of the particles being capable of injecting negative charge carriers into the light-emissive material; whereby electrical charge may pass between the electrodes via at least some of the particles to cause light to be emitted by the light-emissive material between those particles.

According to a second aspect of the present invention there is provided a method for forming a light-emissive device, comprising: forming a first electrode; depositing over the first electrode a light-emissive layer comprising organic light-emissive material including a plurality of particles spaced from each other by the light-emissive material, at least some of the particles being capable of injecting positive charge carriers into the light-emissive material and at least some of the particles being capable of injecting negative charge carriers into the light-emissive material; and forming a second electrode over the light-emissive layer.

Preferably, each of the said particles comprises a first material capable of injecting positive charge carriers into the light-emissive material and a second material capable of injecting negative charge carriers into the light-emissive material. Preferably, each of the said particles comprises either a first material capable of injecting positive charge carriers into the light-emissive material or a second material capable of injecting negative charge carriers into the light-emissive material. Other particles may also be present.

Suitably, the first material has a work function above 4.3 eV, more preferably above 4.5 eV. Suitably, the second material has a work function below 3.5 eV, more preferably below 3.2 eV.

Preferably, all the dimensions of the particles are smaller than the thickness of the organic light-emissive material. The particles are suitably smaller than 100 nm, preferably smaller than 50 nm and could be smaller than 20 nm. The particles are suitably larger than 5 nm and more preferably larger than 10 nm.

The mean spacing between the particles is suitably in the range from 40 to 200 nm, more preferably in the range from 60 to 150 nm and most preferably in the range from 80 to 100 nm. Other spacings could be used.

It can be advantageous for the size of the particles to be in the range from 0.5 to 0.67 of the mean spacing between the particles.

The size of the particles may be defined by the mean diameter of the particles. The spacing between the particles may be defined by the spacing between the closest points on the surfaces of adjacent particles.

The particles are preferably translucent, most preferably transparent Examples of suitable low work function materials for translucent particles include fluorides and oxides of lithium and calcium. Examples of suitable high work function materials for translucent particles include indium-tin oxide (ITO) and polystyrene sulphonic acid doped polyethylene dioxythiophene ("PEDOT-PSS"). The particles could consist of organic and/or inorganic materials.

Preferably, the thickness of the light-emissive layer is greater than 1 μm. The thickness of the light-emissive layer could be greater than 10 μm, greater than 50 μm, or greater than 100 μm. Preferably the thickness of the light-emissive layer is greater than 500 nm.

The device is suitably capable of emitting light (for a prolonged period) when a voltage of 20V, 50V, 100V, 110V, 200V, 220V or greater is applied between the electrodes. Suitably the device does not break down when such a voltage is applied across it.

Suitably one of the electrodes comprises a material capable of injecting positive charge carriers into the light-emissive material and the other of the electrodes comprises a material capable of injecting negative charge carriers into the light-emissive material.

The device is preferably capable of emitting light irrespective of whether the first electrode is biased positively or negatively with respect to the second electrode. Thus, the device is preferably capable of emitting light in both phases of an alternating current cycle applied across the electrodes.

The organic light-emissive material is suitably a polymer material, preferably semiconductive polymer material and preferably a conjugated (either fully or partially) polymer material. Alternatively, one or more of the electroluminescent materials could be a non-polymeric organic material, such as a small molecule material, an oligomer material or a monomer material.

The device may suitably include one or more additional layers. One example of such an additional layer is a charge transport layer, which could be located between either of the electrode layers and the light-emissive layer. There could be further charge transport layers located between the light-emissive layer and the same or the other electrode. The or each charge transport layer may suitably comprise one or more polymers such as polystyrene sulphonic acid doped polyethylene dioxythiophene ("PEDOT-PSS"), poly(2,7-(9,9-di-n-octylfluorene)-(1,4-phenylene-(4-imino(benzoic acid))-1,4-phenylene-(4-imino(benzoic acid))-1,4-phenylene)) ("BFA"), polyaniline and PPV.

Each of the particles may be wholly or partially coated with a charge transport material. Such a material is preferably capable of assisting transfer of charge carriers to and/or from the particles.

The organic light-emissive material is suitably an organic material, for example a polymer, oligomer or small molecule material such as Alq3. The material is preferably a substantially conjugated polymer. The polymer could be a copolymer including fluorene units.

Light is suitably emitted in the matrix, preferably by recombination of charge carriers injected into the matrix from the particles.

One of the electrodes (a hole-injecting or anode electrode) may have a work function of greater than 4.3 eV. That electrode may comprise a metallic oxide such as indium-tin oxide ("ITO") or tin oxide ("TO"). The other electrode (a electron-injecting or cathode electrode) may have a work function less than 3.5 eV. That electrode may suitably be made of a metal with a low work function (Ca, Ba, Yb, Sm, Li etc.) or an alloy or multi-layer structure comprising one or more of such metals together optionally with other metals (e.g. Al).

The device is suitably capable of emitting light when alternating current (AC) is applied across the electrodes, and advantageously during both phases of the AC cycle—i.e. in both directions of drive. In that case, suitably the electrodes are of intermediate work function material; having, for example, a work function between 3.5 eV and 4.3 eV. Alternatively, each electrode may comprise zones of high work function (i.e. above 4.3 eV) material and zones of low work function (i.e. below 3.5 eV) material.

At least one of the electrodes is suitably light transmissive, and preferably transparent, suitably to light emitted from the light-emissive regions.

BRIEF DESCRIPTION OF THE DRAWINGS

The present invention will now be described by way of example with reference to the accompanying drawings, in which.

DETAILED DESCRIPTION

Figure 4:
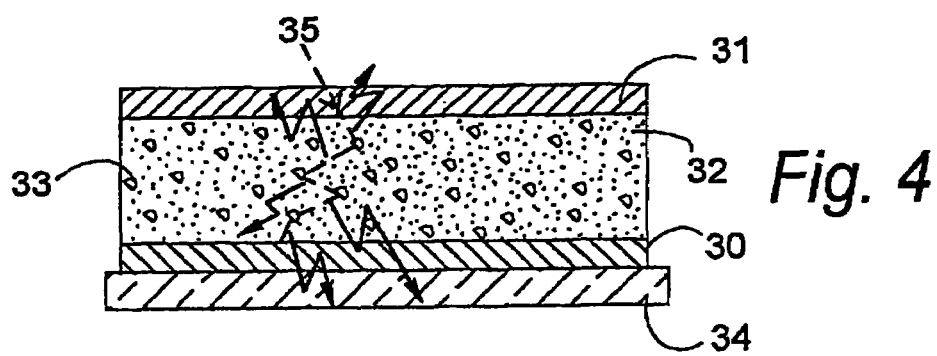
FIG. 4 shows the structure of a device according to the present invention.

FIG. 4 shows an organic light-emitting device comprising an anode 30, which is supported by a glass sheet 34, and a cathode 31. Sandwiched between the anode and the cathode is a composite layer. The composite layer comprises a matrix 32 of organic light-emissive material, in which is a dispersion of particles 33. The particles 33 are capable of accepting charge carriers from and releasing charge carriers to the matrix.

When a voltage is applied across the device current can flow between the electrodes in a series of steps from one particle to the next (see path 35, for example). At each step there Is a voltage drop and light is emitted from the light-emissive material as charge carriers are combined in it at the steps between particles.

Figure 1:
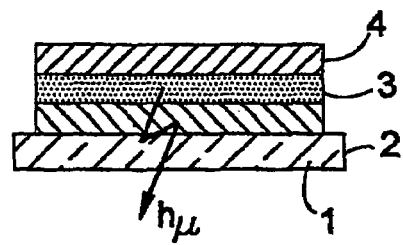
FIG. 1 shows the basic structure of an OLED.
Figure 2:
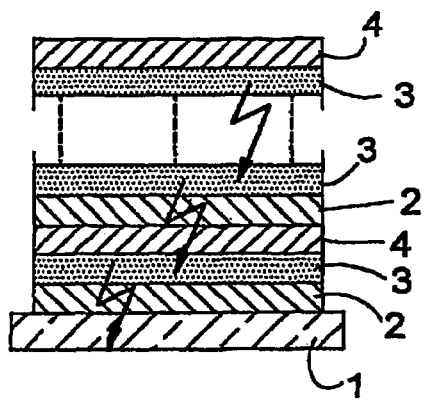
FIG. 2 illustrates a stacked OLED structure.
Figure 3:
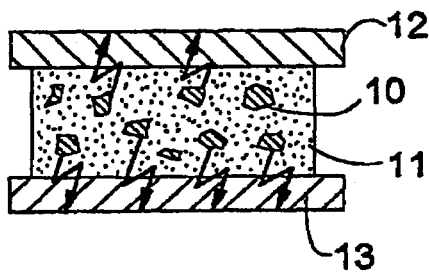
FIG. 3 shows the structure of a dispersed-type inorganic electroluminescent device.

The total voltage drop across the device is the sum of the plurality of voltage drops from the individual steps. Thus the device can be driven effectively for light emission at a higher applied voltage than a conventional device as shown in FIG. 1. The average spacing between the closest points on the surfaces of particles and the thickness of the layer can be chosen so that the device operates efficiently at a predetermined design voltage. The average spacing between the particles is a function of the particle size and the loading of the particles in the matrix. For example, suppose that the particle size and loading is such that the mean spacing is around 80 nm and that efficiency is achieved for an applied voltage of 4V across such a gap. In that case, if the thickness of the matrix is selected so that on average there are be around 55 hops from one particle to its nearest neighbour then the device will be expected to be efficient for an applied voltage between the electrodes of around 55×4=220V. Other thicknesses can be selected to give efficiency at other voltages.

An additional advantage derives from the fact that the film 32 of light-emissive material can be significantly thicker than in conventional devices. This make the process of depositing the film much easier since the processes needed to deposit thicker films are less demanding than those needed to deposit thinner films, and a wider manufacturing tolerance can be allowed in the thickness of the film.

The device is arranged such that at each step current may flow across part of the layer 32 between a high work-function material and a low work-function material. In one embodiment the anode 30 is formed of relatively high work-function material; the cathode 31 is formed of relatively low work-function material; and each of the particles 33 comprises a region of relatively high work-function material and a region of relatively low work-function material. Alternatively, the electrodes and/or the particles may be of an intermediate work-function material.

Figure 5:
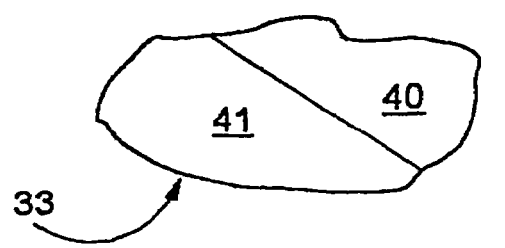
FIG. 5 illustrates the structure of a particle in the device of FIG. 4.

FIG. 5 illustrates the make-up of one of the particles 33. Each particle comprises a region 40 of a relatively high work-function material and a region 41 of a relatively low-work function material. Both of the regions are exposed at the particle's surface, and are electrically coupled—by virtue of being in contact, in this embodiment—so that current can flow from the matrix into the particle via one region and out of the particle via the other region. A practical device is likely to contain a large number of such particles, so it is immaterial if a few of the particles are malformed.

The low work-function materials discussed above preferably have work functions below 3.5 eV and more preferably below 3.0 eV. Suitable materials include calcium, barium, lithium etc. The particles of low work-function material are preferably translucent (including transparent) and/or sufficiently small that they will not interfere with light transmission through the device.

The high work-function materials discussed above preferably have work functions above 4.3 eV and more preferably above 4.5 eV. Suitable materials include indium-tin oxide (ITO), tin oxide (TO) and gold. The particles of high work-function material are preferably translucent (including transparent) and/or sufficiently small that they will not interfere with light transmission through the device.

The light-emissive materials discussed above are preferably organic polymer, small molecule or oligomer materials. Suitable materials include conjugated fluorenes, amines and copolymers thereof.

The loading and the size of the particles in the embodiment of FIG. 4 are selected so that the mean distance between particles in the device is such as to provide efficient emission. In a typical case this will be around 80 to 100 nm. The thickness of the layer 32 is selected in conjunction with the size of the particles so that the average number of steps taken by current flowing through the device equals the total voltage to be applied divided by the average voltage drop per step required (and also taking any other resistive losses into account if necessary). This provides for efficient multi-step emission at the desired drive voltage. The average number of steps, and the required density or loading of particles, may be determined by conventional statistical analysis or by experimentation. The layer 32 will typically be significantly thicker than in a single step device of the type illustrated in FIG. 1, so that a plurality of emission steps can be accommodated.

One factor that affects the efficiency of the device is the extent of inter-particle gaps in the device across which efficient emission can occur. For a given matrix material and given anode and cathode materials there will be an optimum voltage which when applied across the matrix between sites on adjacent particles will cause optimally efficient emission. The size of the particles and the spacing between the particles generally interact in determining the number of sites for which such efficient emission can occur. If the particles are too small in comparison to the mean inter-particle spacing then the surface area of each particle will be relatively small, so the volume within which efficient emission can occur will be low. If the particles are too large in comparison to the mean inter-particle spacing then the loading of the particles in the matrix will be so high that, again, the remaining volume of the matrix within which efficient emission can occur will be low. Intermediate ratios of particle size to mean inter-particle spacing provide a compromise. Studies carried out by the applicant indicate that for typical devices, optimum efficiencies are achieved when the particle size is from a half to two thirds of the mean Inter-particle distance (i.e. the mean closest distance between adjacent particles). At such intermediate ratios, the particles will have relatively small degrees of curvature in comparison to smaller particles, and fairly efficient emission can occur between enlarged regions on adjacent particles at a range of voltages on either side of the optimum voltage.

The particles may be organic or inorganic or a combination of the two. Organic particles, or inorganic particles coated with an organic material—for example for charge transport—may interact more favourably with the organic matrix.

The particles 33 are preferably sufficiently small that they do not interfere with light emitted from the matrix 32, but sufficiently large that the regions 40 and 41 can exhibit different, bulk work functions. The particles should also be sufficiently small that individual particles will not cause a short between the anode and cathode regions.

In some circumstances the device could be successfully driven by AC or (as is conventional) DC. For example, the electrodes could be of an intermediate work-function material, and current could flow in either direction to the particles, and through the device. Alternatively, both of the electrodes could comprise regions of high and low work function material at their interfaces with the light-emitting layer. The electrodes could then function efficiently as both anode and cathode, depending on the direction of the applied voltage. The regions of high and low work function material in each electrode could be interdigitated.

To form a device of the type shown in FIG. 4, the anode could be an ITO layer on a glass sheet. Such anode constructions are commonly available commercially. Over the anode the mixture of light-emissive material and particles could be deposited by spin-coating or printing to a suitable thickness for the desired drive voltage, which may, for instance, be around 8 microns. The cathode could be of aluminium evaporated on to the emissive layer. The device may then be encapsulated by the application of a glass cover sheet over the aluminium and an epoxy seal between the glass sheets, with electrodes connected to the anode and cathode for external application of a voltage.

The colour of emission from the device can be determined by suitable choice of the light-emissive material, and multicolour devices can be formed by providing multiple printed regions of different emissive materials.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

The invention claimed is:

1. A light-emissive device comprising:
first and second electrodes: and
a light-emissive layer located between the electrodes and comprising organic light-emissive material including a plurality of particles spaced from each other by the light-emissive material, at least some of the particles being capable of injecting positive charge carriers into the light-emissive material and at least some of the particles being capable of injecting negative charge carriers into the light-emissive material;
whereby electrical charge may pass between the electrodes via at least some of the particles to cause light to be emitted by the light-emissive material between those particles;
wherein the size of the particles is in the range from 0.5 to 0.67 of the mean spacing between the particles.

2. A light-emissive device as claimed in claim 1, wherein each of said particles comprises a first material capable of injecting positive charge carriers into the light-emissive material and a second material capable of injecting negative charge carriers into the light-emissive material.

3. A light-emissive device as claimed in claim 2, wherein the first material has a work function above 4.3 eV.

4. A light-emissive device as claimed in claim 3, wherein the second material has a work function below 3.5 eV.

5. A light-emissive device as claimed in claim 2, wherein the second material has a work function less than 3.5 eV.

6. A light-emissive device as claimed in claim 1, wherein each said particle has at least a partial coating of charge transport material.

7. A light-emissive device as claimed in claim 1, wherein the particles are smaller than 100 nm.

8. A light-emissive device as claimed in claim 1, wherein the mean spacing between the particles is in the range from 40 nm to 200 nm.

9. A light-emissive device as claimed in claim 1, wherein the thickness of the light-emissive layer is greater than 500 nm.

10. A light-emissive device as claimed in claim 1, wherein the device is capable of emitting light when a voltage of 20V or greater is applied between the electrodes.

11. A light-emissive device as claimed in claim 1, wherein both of the electrodes comprise regions of a material having a work function less than 3.5 eV and regions of a material having a work function above 4.3 eV.

12. A light-emissive device as claimed in claim 11, wherein the device is operable to emit light when the first electrode is biased positively with respect to the second electrode and when the second electrode is biased positively with respect to the first electrode.

13. A light-emissive device as claimed in claim 1, wherein the device is operable to emit light when the first electrode is biased positively with respect to the second electrode and when the second electrode is biased positively with respect to the first electrode.

14. A light-emissive device as claimed in claim 1, wherein said first electrode is an anode and said second electrode is a cathode, the light-emissive device further comprising:
a glass sheet supporting said anode,
said anode comprising a material having a relatively high work function above 4.3 eV, and said cathode comprising a material having a relatively low work function below 3.5 eV; and,
each of said particles comprising a region of relatively high work function method having a work function above 4.5 eV and a region of a relatively low work function method having a work function below 3.5 eV.

15. A light-emissive device as claimed in claim 14, wherein said relatively high work function is above 4.5 eV.

16. A light-emissive device as claimed in claim 15, wherein said relatively low work function is below 3.0 eV.

17. A light-emissive device as claimed in claim 14, wherein said relatively low work function is below 3.0 eV.

18. A light-emissive device as claimed in claim 14, wherein said high work function method is selected from the group consisting of indium-tin oxide, tin oxide, and gold.

19. A light-emissive device as claimed in claim 14, wherein the particles of relatively high work function method are translucent.

20. A light-emissive device as claimed in claim 14, wherein the particles of relatively high work function method are transparent.

21. A light-emissive device as claimed in claim 14, wherein the light-emissive method is selected from the group consisting of organic polymers, small molecules, and oligomers.

22. A light-emissive device as claimed in claim 21, wherein the light-emissive material is selected from the group consisting of conjugated fluorenes, amines, and copolymers thereof.

23. A light-emissive device as claimed in claim 14, wherein the anode comprises indium-tin oxide.

24. A method of forming a light-emissive device as claimed in claim 14, comprising the steps of:
depositing a mixture of said light-emissive material and said particles over the anode to a desired thickness to form an emissive layer:
depositing the cathode on the emissive layer;
providing electrical connections to the anode and cathode; and
encapsulating the device.

25. The method of claim 24, comprising depositing the cathode by evaporative coating.

26. The method of claim 24, wherein the anode comprises indium-tin oxide and the cathode comprises aluminum.

27. The method of claim 24, wherein the emissive layer thickness is about 8 microns.

28. The method of claim 24, comprising encapsulating the device by applying a glass cover sheet over the cathode and an epoxy seal between the glass sheets.

29. A light-emissive device as claimed in claim 1, wherein each of said particles comprises a material having a work function between 3.5 eV and 4.3 eV.

30. A light-emissive device as claimed in claim 1, wherein one of the electrodes comprises a material having a work function less than 3.5 eV and the other electrode comprises a material having a work function above 4.3 eV.

31. A light-emissive device comprising:
first and second electrodes: and
a light-emissive layer located between the electrodes and comprising organic light-emissive material including a plurality of particles spaced from each other by the light-emissive material, at least some of the particles being capable of injecting positive charge carriers into the light-emissive material and at least some of the particles being capable of injecting negative charge carriers into the light-emissive material;

whereby electrical charge may pass between the electrodes via at least some of the particles to cause light to he emitted by the light-emissive material between those particles;

wherein both of the electrodes comprise a material having a work function between 3.5 eV and 4.3 eV.

32. A light-emissive device as claimed in claim 31, wherein each of said particles comprises a first material capable of injecting positive charge carriers into the light-emissive material and a second material capable of injecting negative charge carriers into the light-emissive material.

33. A light-emissive device as claimed in claim 31, wherein each said particle has at least a partial coating of charge transport material.

34. A light-emissive device as claimed in claim 31, wherein the particles are smaller than 100 nm.

35. A light-emissive device as claimed in claim 31, wherein the mean spacing between the particles is in the range from 40 nm to 200 nm.

36. A light-emissive device as claimed in claim 31, wherein the size of the particles is in the range from 0.5 to 0.67 of the mean spacing between the particles.

37. A light-emissive device as claimed in claim 31, wherein the thickness of the light-emissive layer is greater than 500 nm.

38. A light-emissive device as claimed in claim 31, wherein the device is operable to emit light when the first electrode is biased positively with respect to the second electrode and when the second electrode is biased positively with respect to the first electrode.

39. A light-emissive device as claimed in claim 31, wherein each of said particles comprises a region of relatively high work function method having a work function above 4.3 eV and a region of a relatively low work function method having a work function below 3.5 eV.

40. A light-emissive device as claimed in claim 31, wherein each of said particles comprises a material having a work function between 3.5 eV and 4.3 eV.

* * * * *

UNITED STATES PATENT AND TRADEMARK OFFICE
CERTIFICATE OF CORRECTION

| | | |
|---|---|---|
| PATENT NO. | : 7,271,533 B2 | Page 1 of 1 |
| APPLICATION NO. | : 10/485618 | |
| DATED | : September 18, 2007 | |
| INVENTOR(S) | : Julian Carter et al. | |

It is certified that error appears in the above-identified patent and that said Letters Patent is hereby corrected as shown below:

At Column 9, line 8, "he emitted" should be -- be emitted --.

Signed and Sealed this

Twenty-ninth Day of April, 2008

JON W. DUDAS
*Director of the United States Patent and Trademark Office*